United States Patent
Cai et al.

(10) Patent No.: US 6,812,533 B2
(45) Date of Patent: Nov. 2, 2004

(54) SOI BASED BIPOLAR TRANSISTOR HAVING A MAJORITY CARRIER ACCUMULATION LAYER AS SUBCOLLECTOR

(75) Inventors: Jin Cai, Mohegan Lake, NY (US); Tak H. Ning, Yorktown Heights, NY (US); Qiqing Ouyang, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 10/328,694

(22) Filed: Dec. 24, 2002

(65) Prior Publication Data

US 2004/0119136 A1 Jun. 24, 2004

(51) Int. Cl.[7] ............................................... H01L 29/76
(52) U.S. Cl. ...................... 257/397; 257/197; 438/297; 438/439
(58) Field of Search .................................. 257/197, 370

*Primary Examiner*—Fetsum Abraham
(74) *Attorney, Agent, or Firm*—Michael J. Buchenhorner; Wang Yee Cheung

(57) ABSTRACT

An electronic circuit comprises a bipolar transistor that includes a conductive back electrode, an insulator layer over the conductive back electrode and a semiconductor layer of either an n-type or p-type material over the insulator layer. The semiconductor layer includes a doped region, used as the collector and a heavily doped region, bordering the doped region, used as a reachthrough between the insulator layer and the collector contact electrode. A majority-carrier accumulation layer is induced adjacent to the insulator in the doped region of the collector by the application of a bias voltage to the back electrode.

18 Claims, 12 Drawing Sheets

SOI BASED BIPOLAR TRANSISTOR HAVING A MAJORITY CARRIER ACCUMULATION LAYER AS SUBCOLLECTOR

FIELD OF THE INVENTION

The invention disclosed broadly relates to the field of semi-conductor devices, and more particularly relates to the field of bipolar transistors.

BACKGROUND OF THE INVENTION

Referring to FIG. 1, a conventional vertical npn (n-type emitter, p-type base, n-type collector) bipolar transistor 100, shown schematically, has a heavily doped buried subcollector (SC) 102 underneath the collector (C) 104. The subcollector layer 102 is quite thick, typically around 2000 nanometers (nm), to minimize collector series resistance. To ensure that the subcollector is effective in reducing collector series resistance, there is a collector reachthrough region 106 which provides a low-resistance connection between the subcollector layer 102 and the collector contact electrode 108 located at the top of the silicon surface. The collector reachthrough 106 is usually a heavily doped semiconductor region of the same type as the collector and subcollector. For the vertical npn transistor shown in FIG. 1, the n+reachthrough is also shown. The transistor 100 also comprises a base layer 110 located over the collector 104 and an emitter 112 located over the base 110. There is a space-charge region, also called a depletion region 114, associated with the p/n diode formed between the base 110 and the collector 104. In a typical bipolar transistor, this depletion region is formed mostly from the relatively lightly doped collector of the base-collector diode. Therefore, the collector 104 consists of the space-charge region 114 and the quasi-neutral region 118. The subcollector 102 is located on a p-type substrate 116.

Referring to FIG. 2, there is shown schematically a conventional npn bipolar transistor 200 built on an insulator 204. The transistor 200 comprises a substrate 202, an insulator 204, and an n+subcollector region 206 above the insulator 204. The collector 208 includes a depleted region 210 bordering the base 212. An emitter 214 is located above the p-type base 212. For some applications, it is desirable to build a vertical bipolar transistor on an insulator. However, the silicon layer on the insulator must be thick in order to accommodate the thick subcollector layer. Such thick-silicon Silicon-on-Insulator (SOI) technology is not compatible with SOI Complementary Metal-Oxide Silicon (CMOS) which employs thin-silicon SOI technology.

Referring to FIG. 3, there is shown a thin-silicon SOI vertical npn bipolar transistor 300 which is compatible with SOI CMOS. Such a structure is discussed in U.S. patent application Ser. No. 09/757,965, filed Jan. 10, 2001, T. H. Ning, "Silicon-on-insulator (SOI) bipolar transistor useful alone or in SOI BiCMOS." Transistor 300 comprises a fully depleted collector 305, with no quasi-neutral collector region and no subcollector region directly underneath the base 306. After traversing the base layer 306, a minority carrier injected from the emitter 308 will drift more-or-less laterally towards a collector reachthrough 310. Thus the speed of this thin-SOI fully-depleted-collector transistor 300 depends on the length of the more-or-less lateral drift path. For a transistor designed using 250-nm rules, the drift-path length can be greater than 700 nm, severely limiting the transistor speed.

Power transistor designers have been using SOI technology to isolate one transistor from another. For example, a high-voltage npn bipolar transistor on a SOI substrate was described in the publication "Analysis of new high-voltage bipolar silicon-on-insulator transistor with fully depleted collector," by T. Arnborg and A. Litwin, in IEEE Trans. Elect. Dev., Vol. 42, No. 1, pp. 172–177, 1995. FIG. 4 shows a schematic of this prior art SOI bipolar device 400. As a power device, there is a large separation between the p-type base region 402 and the n+collector contact region 404 in order to be able to sustain a large reverse bias voltage between the base 402 and the collector contact 404.

The device characteristics of transistor 400 are influenced by the voltage applied to a back electrode 406 underneath the buried oxide 408. The transistor 400 also comprises a first oxide trench 410 on the collector side and a second oxide trench 412 on the emitter side. In particular, the back electrode 406 can be biased to cause majority carrier accumulation near the silicon-oxide interface. However, by not having a collector reachthrough (i.e., a heavily doped n+region connecting between the n+collector contact 404 at the silicon surface to the buried oxide surface 408) there is a high-resistance path between the majority carrier accumulation layer located at the bottom of the silicon layer and the n+collector contact 404 located at the top of the silicon layer. As a result, a majority carrier accumulation layer in this prior art does not function as an effective subcollector layer in substantially reducing the collector series resistance of the transistor. Without a low-resistance collector reachthrough, the prior art device is not suitable for building high-speed transistors, with or without a majority carrier accumulation layer in the collector part of the silicon layer. Therefore, there is a need for a bipolar transistor structure that overcomes the drawbacks of the prior art.

SUMMARY OF THE INVENTION

Briefly, according to the invention, an electronic circuit comprises a bipolar transistor that includes a conductive region serving as a back electrode, an insulator layer over the back electrode and a semiconductor layer of either an n-type or p-type material over the insulator layer. The semiconductor layer includes a doped region used as the collector and a heavily doped region used as a reachthrough between the insulator layer and the contact electrode to the collector. A majority carrier accumulation layer is induced in the collector by the application of a bias voltage (Vs) to the back electrode.

DESCRIPTION OF THE PREFERRED EMBODIMENT

Figure 5:
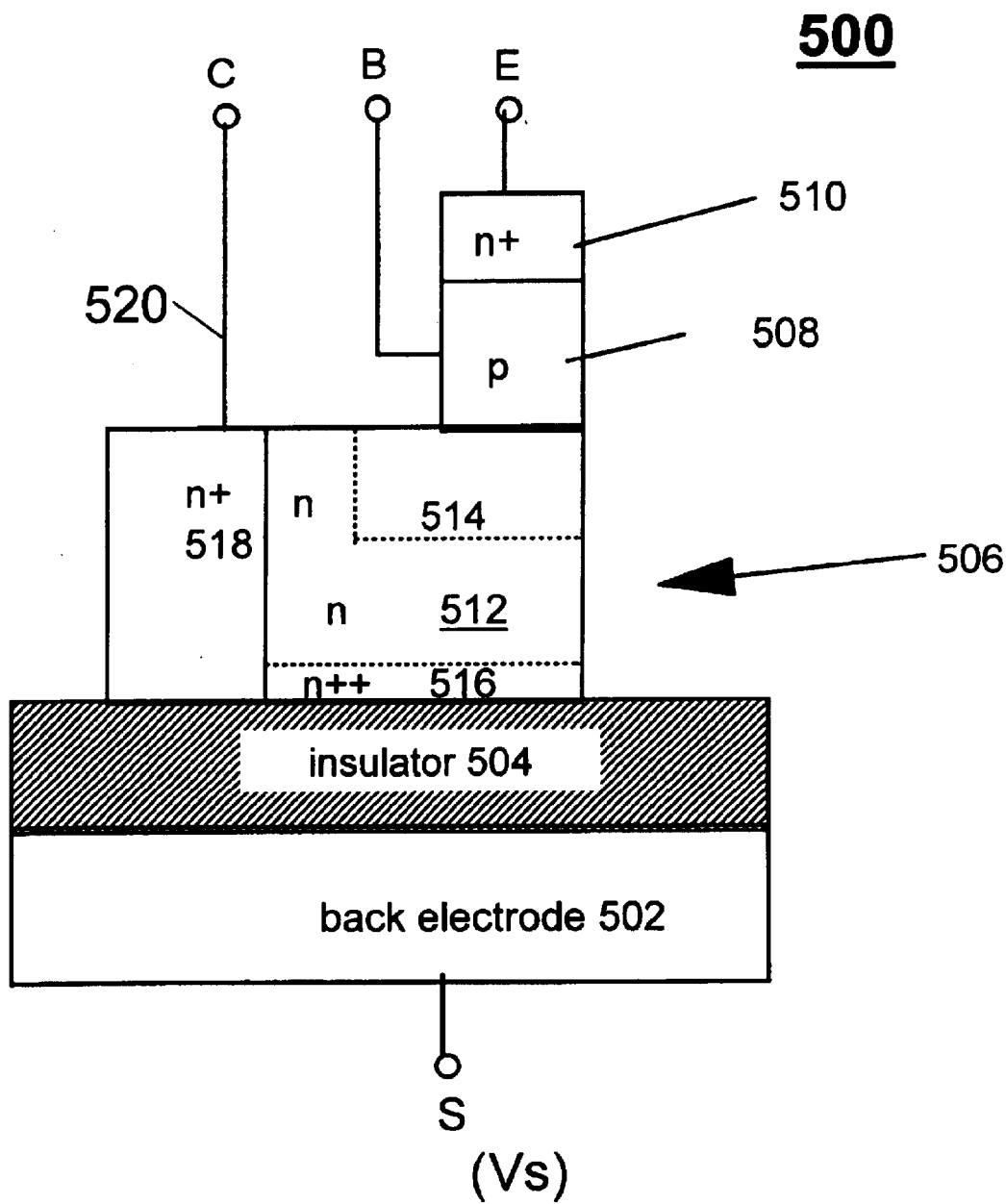
FIG. 5 shows a schematic representation of an npn transistor according to an embodiment of the invention.

Referring to FIG. 5, there is shown a schematic representation of an npn transistor 500 according to an embodiment of the invention. In this embodiment, the SOI vertical bipolar transistor 500 comprises a back electrode 502 for receiving a bias voltage (Vs). The transistor 500 further comprises an insulator layer 504 that is located above the back electrode layer 502. A first semiconductor layer 506 is located above the insulator layer 504. This first layer 506 comprises the collector (regions 512–516) and reachthrough 518 disposed between the insulator layer 504 and the collector contact electrode 520. In this embodiment the reachtrough is made from an n-type heavily doped semiconductor material.

The collector comprises a quasi-neutral region 512, a depletion region 514, and an n++accumulation layer 516 as the subcollector which is electrically connected to the low-resistance collector reachthrough 518.

The back electrode 502 is formed in the substrate of the SOI, and the accumulation layer 516 is formed by applying voltage $V_S$ to the back electrode 502. The accumulation layer 516 serves the purpose of the subcollector layer in a conventional vertical bipolar transistor. Since the accumulation layer 516 is very thin, on the order of 5 nm, it enables a vertical bipolar transistor to be built on SOI that is compatible with SOI CMOS. The first layer 506 can be of a thickness such as 20 to 2000 nanometers.

Figure 1:
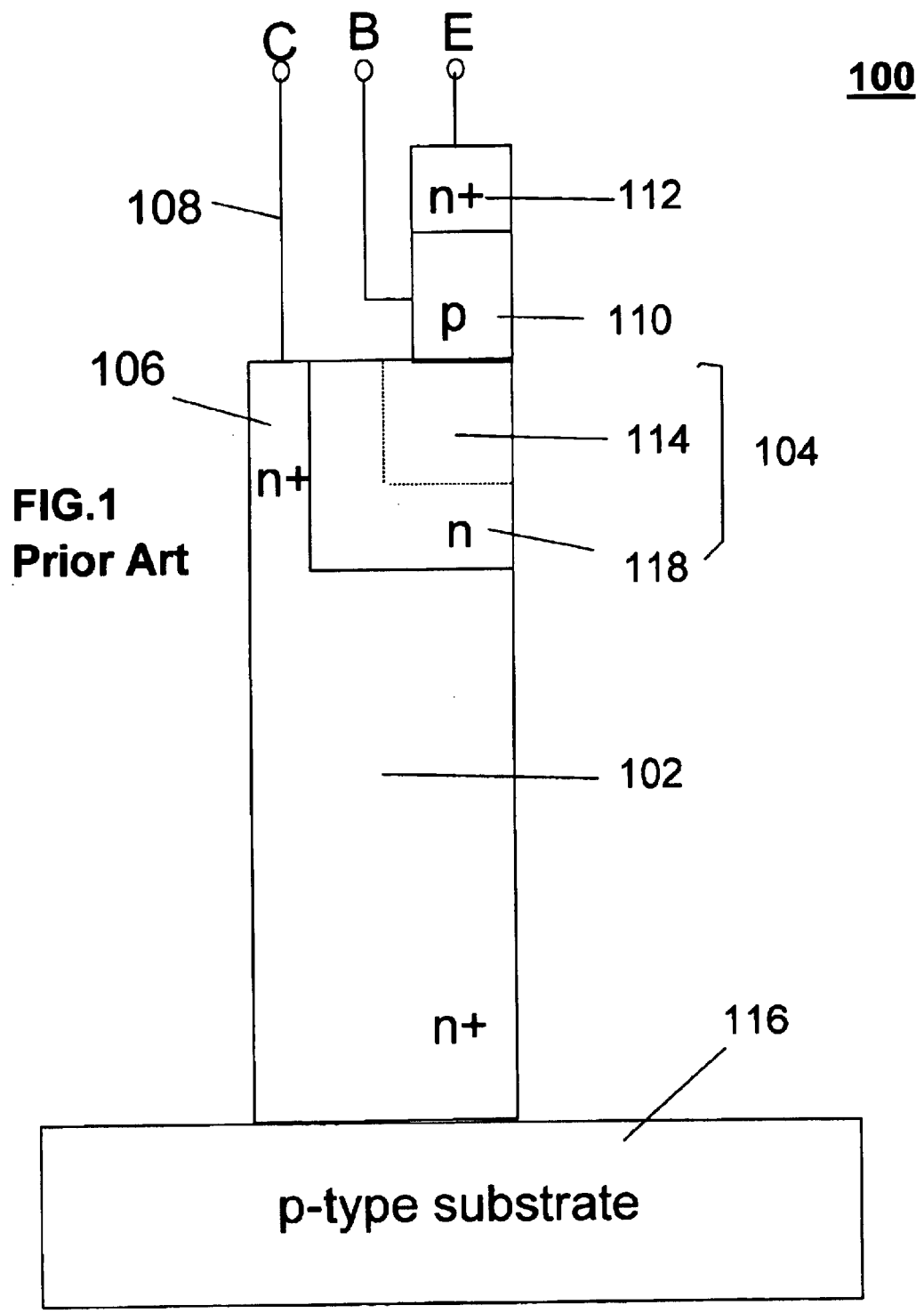
FIG. 1 shows a schematic representation of a conventional vertical npn (n-type emitter, p-type base, n-type collector) bipolar transistor, according to the prior art.
Figure 2:
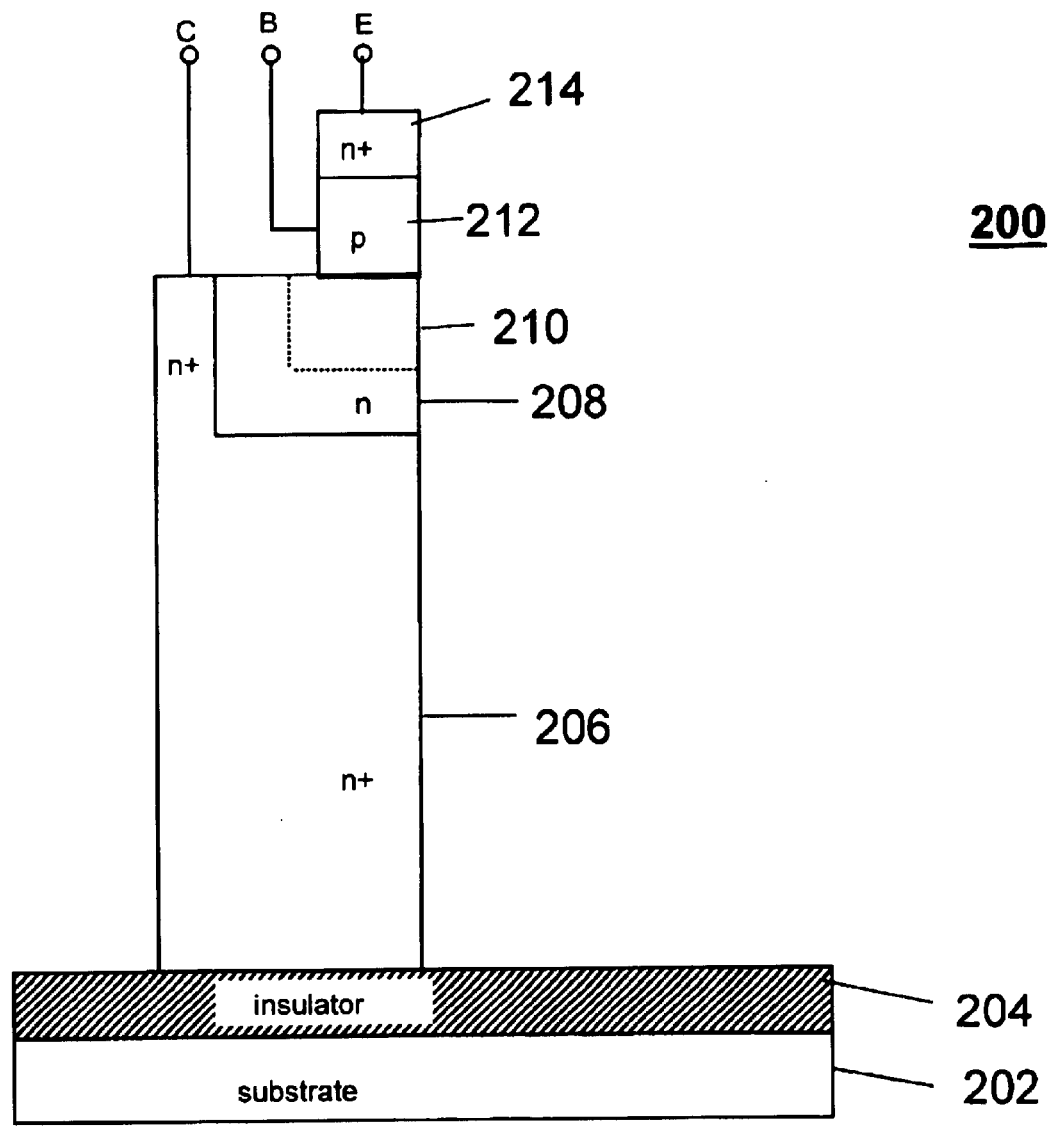
FIG. 2 shows a schematic representation of a conventional npn bipolar transistor built on an insulator, according to the prior art.

Referring again to FIG. 5, the thick subcollector layer of the conventional SOI vertical bipolar transistor, illustrated in FIG. 2, is replaced by the accumulation layer 516. In a conventional transistor, the doping profile of the subcollector is not abrupt and hence there is charge storage associated with the part of the subcollector where the doping concentration is lower than the peak doping concentration when the transistor is operated at high current densities. On the other hand, there is no minority-charge storage associated with an accumulation layer. Therefore, using an accumulation layer 516 as subcollector can lead to faster transistor operation at high current densities.

Figure 6:
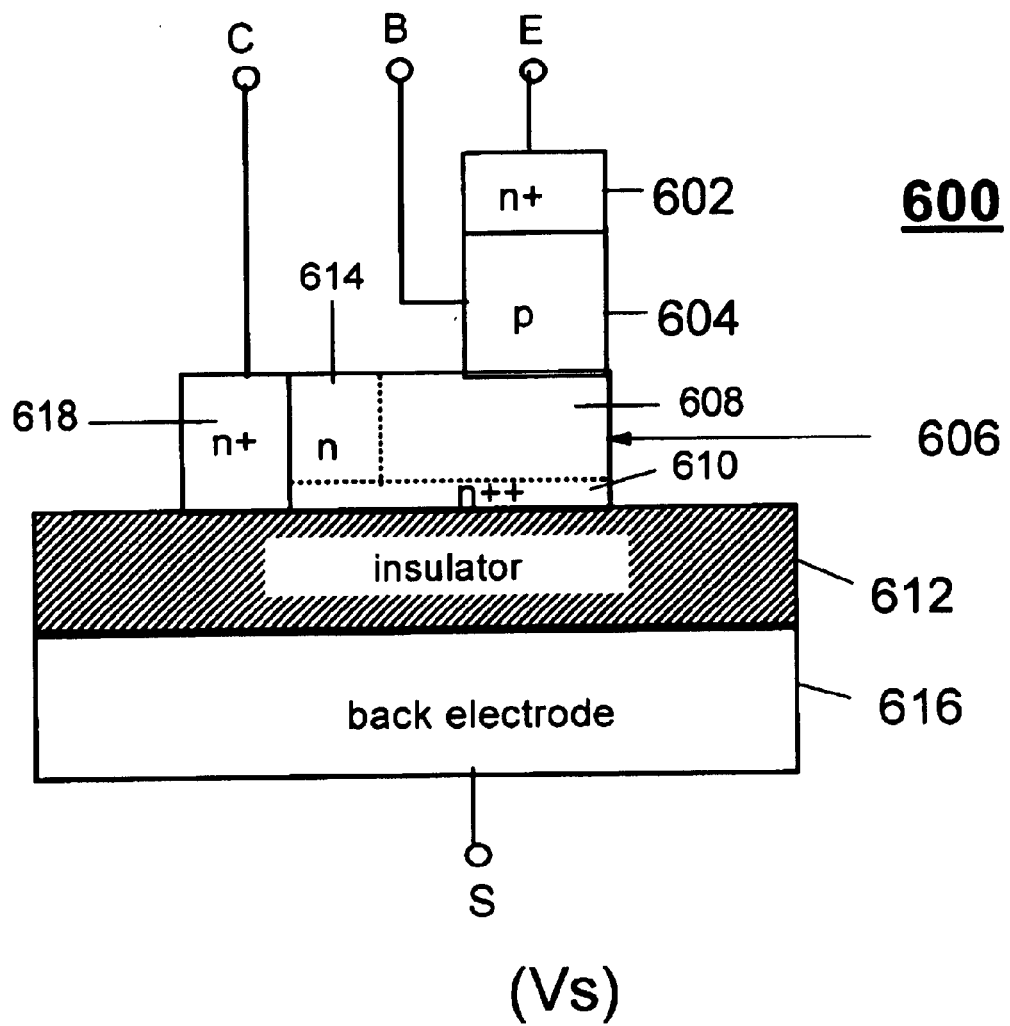
FIG. 6 shows a schematic of a transistor with a fully-depleted collector vertical npn bipolar transistor design according to another embodiment of the invention.

In the embodiment illustrated in FIG. 5, the transistor comprises a base-collector diode with the collector layer 506 having a thickness that is greater than the thickness of the space-charge region of the base-collector diode. It is also possible that the transistor comprises a base-collector diode with the collector layer having a thickness that is less than the thickness of the space-charge region of the base-collector diode, as illustrated in FIG. 6. It is further possible to reverse the conductivity types of the collector, base and emitter.

In an embodiment wherein the first conductivity type of the collector is n-type and the conductivity type of the base is p-type, the back electrode is biased to receive a voltage of zero or positive value.

In an embodiment wherein the first conductivity type of the collector is p-type and the conductivity type of the base is n-type, the back electrode is biased to receive a voltage of zero or negative value.

In one embodiment the base 508 may comprise a silicon-germanium alloy and in another, a silicon-germanium-carbon alloy. Moreover, the conductive back electrode 502 may comprise a doped semiconductor region such as an n-type well in a p-type semiconductor substrate. The transistor 500 is preferably formed in an integrated circuit wherein the conductive back electrode 502 can be common to a plurality of bipolar transistors in the integrated circuit. The conductive back electrodes can also be electrically isolated from each other either by dielectric layers or by p/n junctions.

Referring to FIG. 6, there is shown a schematic of a transistor 600 with a fully-depleted collector vertical npn bipolar transistor design according to another embodiment of the invention. The transistor 600 comprises an n+emitter 602, a p-type base 604, a collector 606, an insulator layer 612, and a back electrode 616. The collector 606 comprises a depleted region 608, an accumulation layer 610, an n-type region 614 and an n+reachthrough 618. The collector 606 and the base 604 form a p/n diode. The thickness of the space-charge region of this base-collector diode is greater than the thickness of the collector layer 606: As a result, there is no quasi-neutral collector region underneath the base 604.

Figure 3:
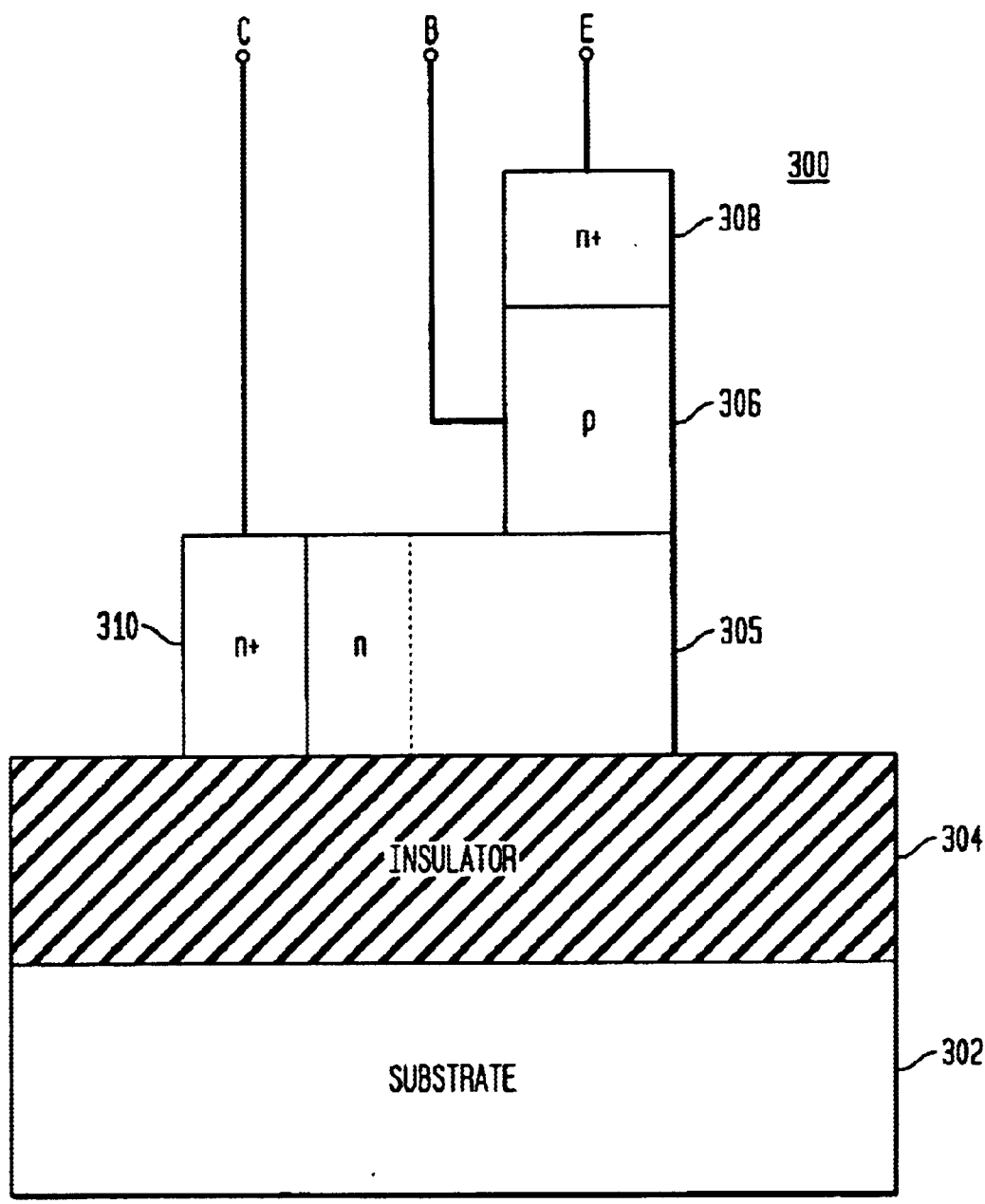
FIG. 3 shows a thin-silicon SOI vertical npn bipolar transistor according to the prior art.
Figure 4:
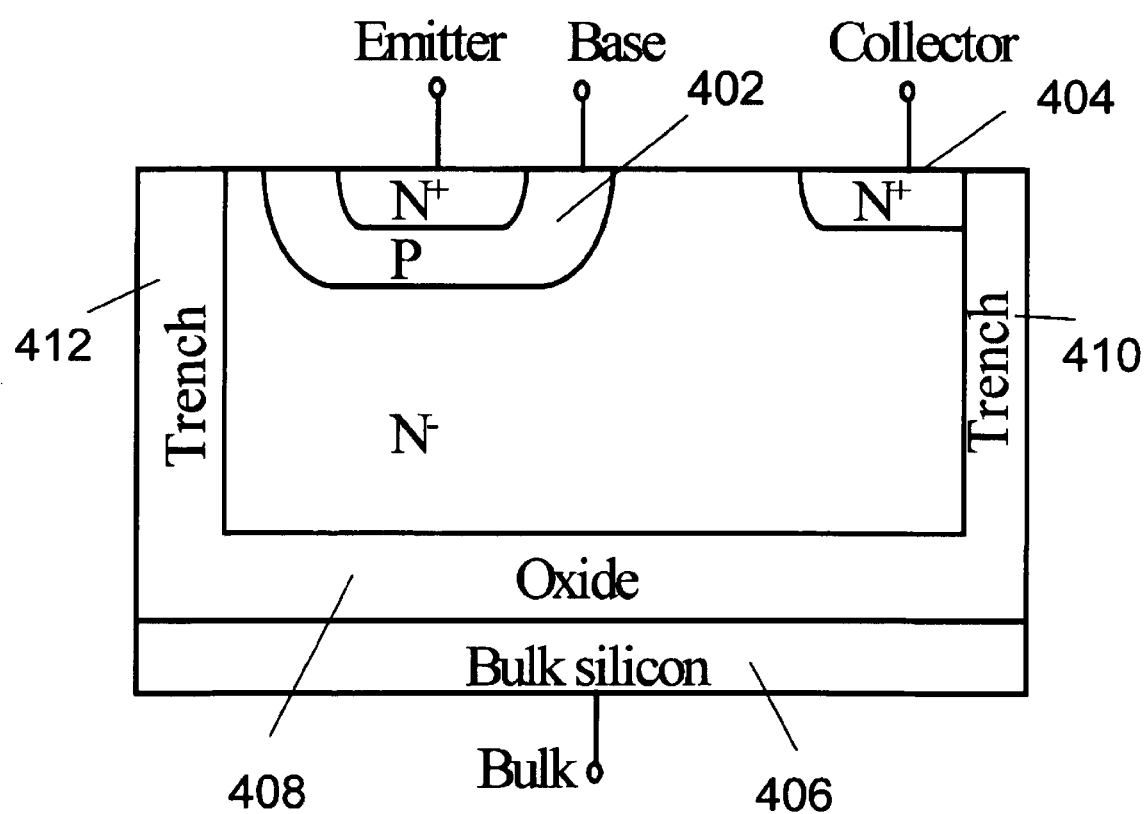
FIG. 4 shows a schematic of an SOI npn bipolar device according to the prior art.
Figure 7:
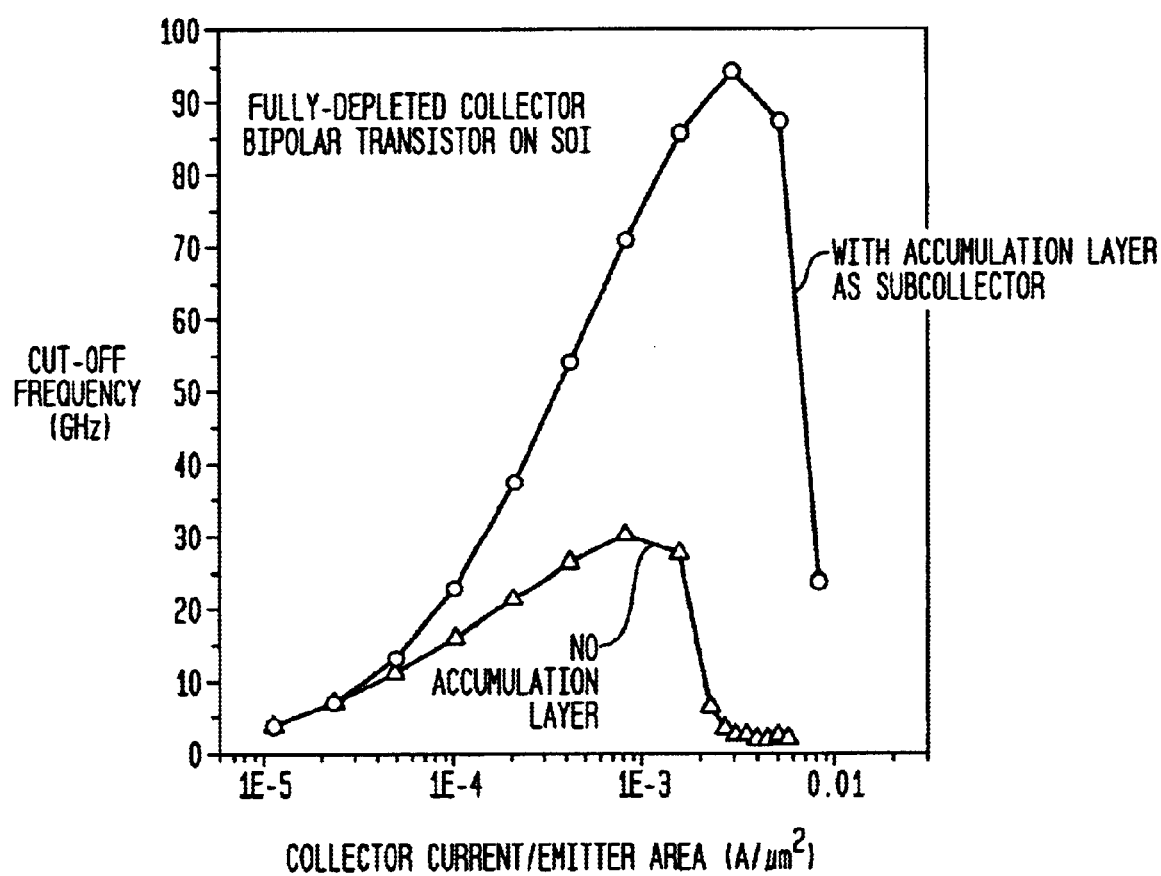
FIG. 7 shows a comparison of the simulated cutoff frequencies of two transistors.

In this transistor 600, the drift-path length of a minority carrier, which has been injected from the emitter 602 and traversed the base layer 604, is simply the vertical separation between the base 604 and the accumulation layer 610. This drift path is typically about 100 nm. Thus, compared to the known fully-depleted-collector bipolar transistor without an accumulation layer subcollector (FIG. 3), a fully-depleted-collector bipolar transistor having an accumulation layer subcollector can be significantly faster. Referring to FIG. 7, this comparison has been confirmed from the simulated cutoff frequencies of the two transistors.

Figure 8:
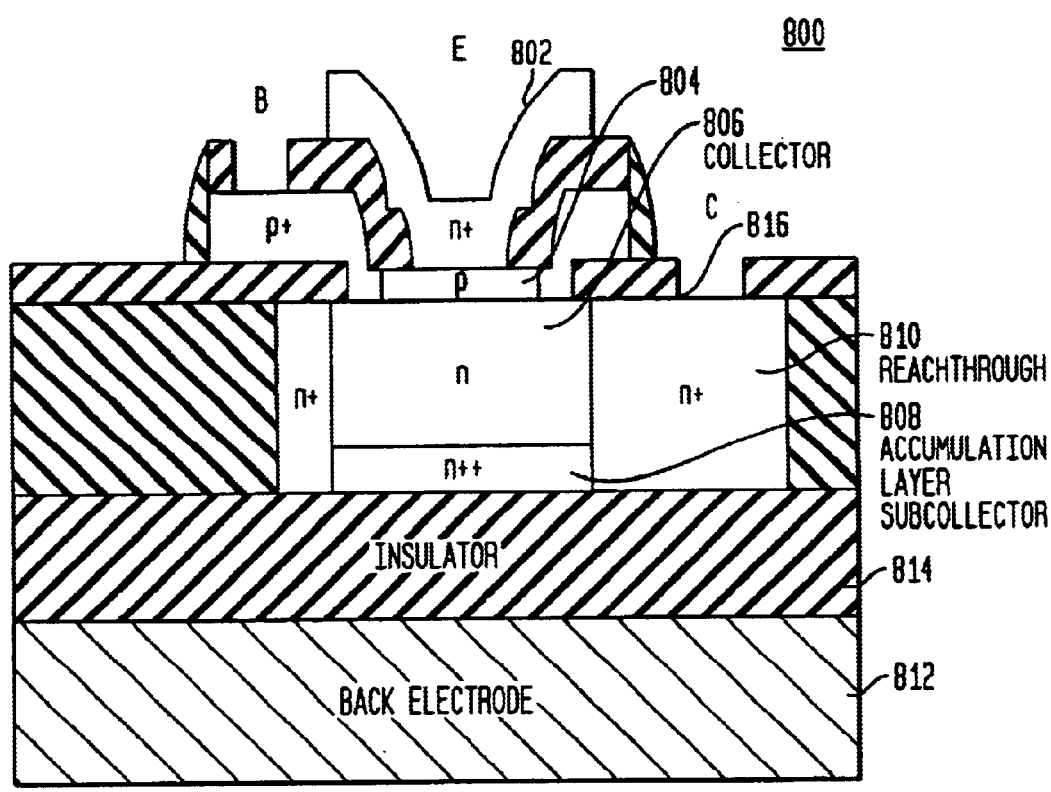
FIG. 8 shows a schematic cross section of an npn transistor according to an embodiment of the invention.

Referring to FIG. 8, there is shown the schematic cross section of an embodiment of the invention comprising an npn transistor 800, comprising an n-type poly-silicon emitter 802, a p-type base 804, and an n-type collector 806, and an accumulation (n++) subcollector layer 808. The accumulation subcollector is electrically connected to the collector contact electrode 816 by a low-resistance n+collector reach-through 810. The n-type collector 806 can be fully depleted or non depleted, depending on the doping concentration and thickness of the n-type collector layer. A back electrode 812 is connected to the insulator 814 for receiving a bias voltage.

The invention can be implemented with any commonly used vertical bipolar structures and processes. A sample fabrication process using a double-poly-silicon non-self-aligned structure and epitaxial deposition of silicon, or silicon-germanium (SiGe) alloy, for forming the intrinsic base, is illustrated at FIGS. 9 through 18.

Figure 9:
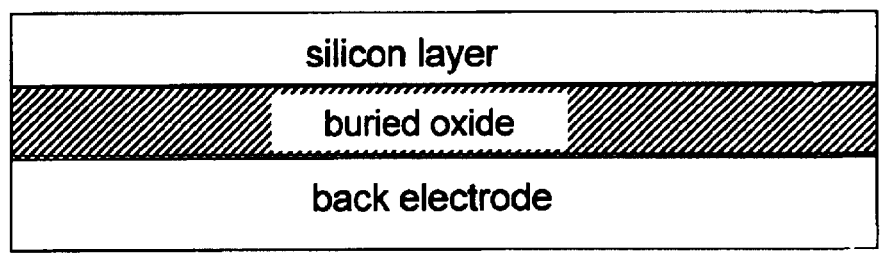
FIG. 9 shows the starting SOI wafer with a back electrode such as a doped silicon layer.

FIG. 9 shows the starting SOI wafer with a back electrode such as a doped silicon layer.

Figure 10:
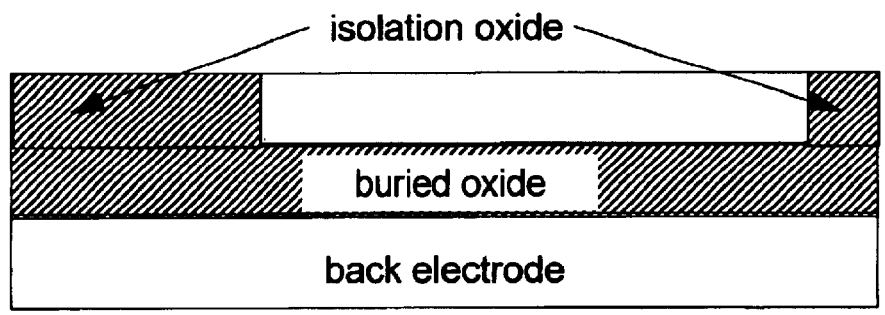
FIG. 10 shows the schematic structure after the formation of a shallow-trench isolation.

FIG. 10 shows the structure after the formation of shallow-trench isolation.

Figure 11:
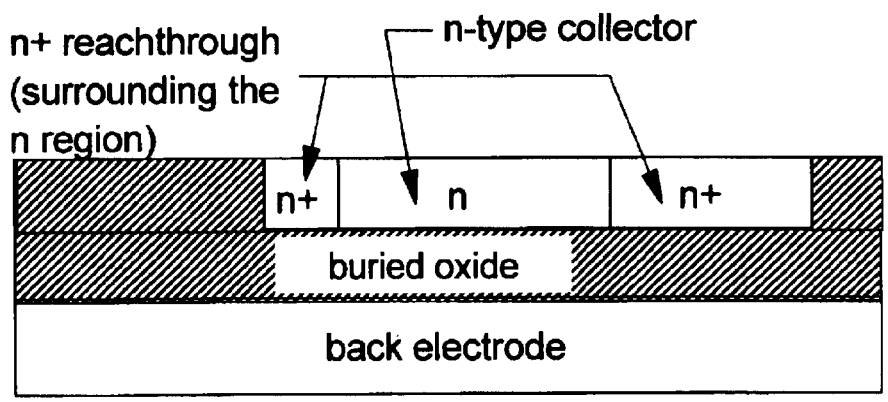
FIG. 11 shows the schematic structure after collector (n-region) and reach-through (n+region) formation.

FIG. 11 shows the structure after collector (n-region) and reach-through (n+region) formation. The n+reachthrough touches the buried oxide.

Figure 12:
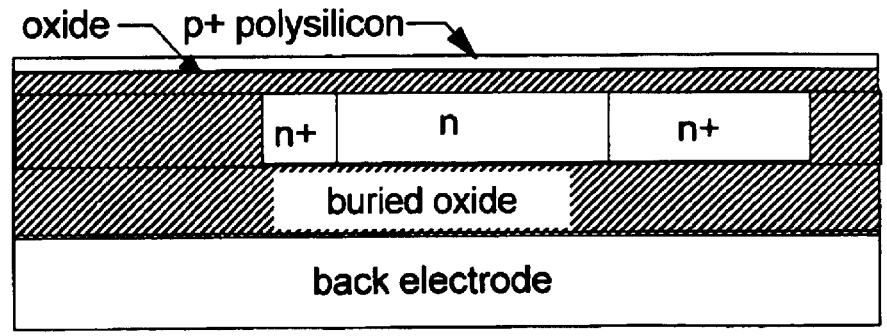
FIG. 12 shows the schematic structure after the deposition of an oxide layer and a p+poly-silicon layer which will become part of the base contact layer.

FIG. 12 shows the structure after the deposition of an oxide layer and a p+poly-silicon layer which will become part of the base contact layer.

Figure 13:
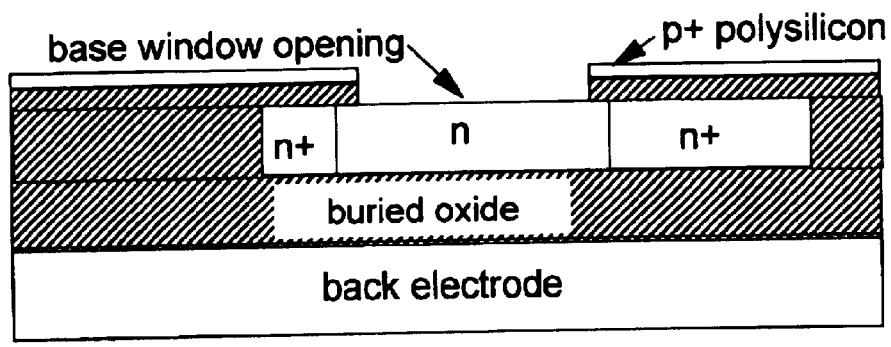
FIG. 13 shows the schematic structure after the base region window is etched open.

FIG. 13 shows the structure after the base region window is etched open.

Figure 14:
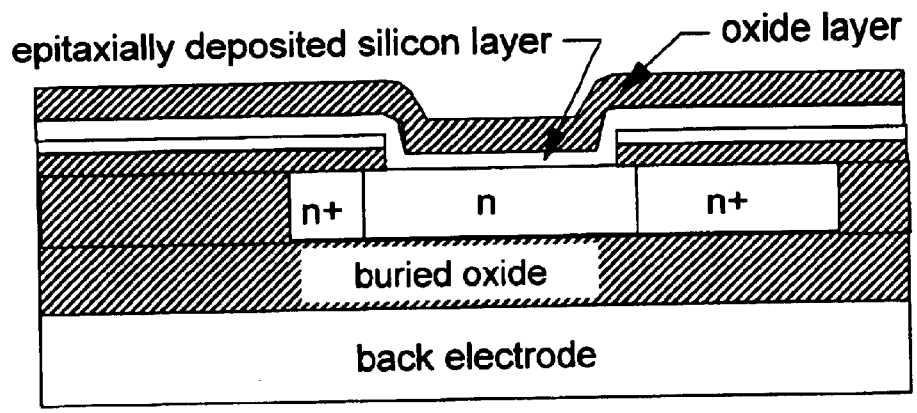
FIG. 14 shows the schematic structure after the deposition of a silicon layer and a subsequent isolation oxide layer.

FIG. 14 shows the deposition of a silicon layer and a subsequent isolation oxide layer. The silicon layer is crystalline over the base window and forms the p-type base of the bipolar transistor.

Figure 15:
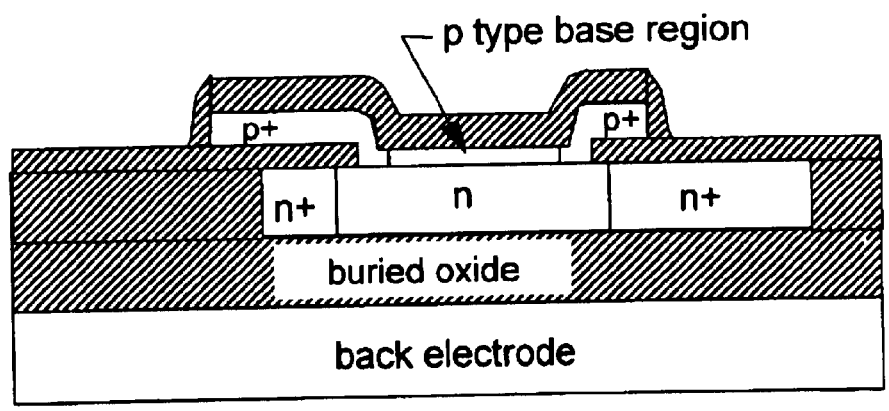
FIG. 15 shows the schematic structure after the base poly-silicon layer is patterned and a sidewall oxide is formed.

FIG. 15 shows the structure after the base poly-silicon layer is patterned and a sidewall oxide is formed.

Figure 16:
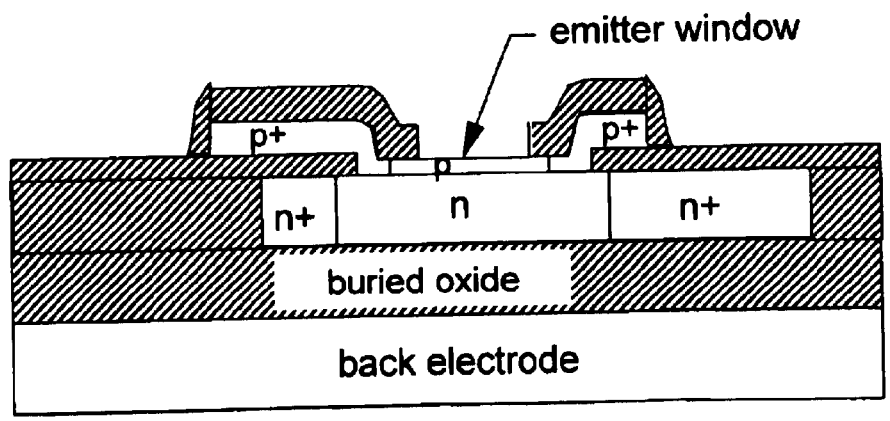
FIG. 16 shows the schematic structure after an emitter window is opened.

FIG. 16 shows the structure after the emitter window is opened.

Figure 17:
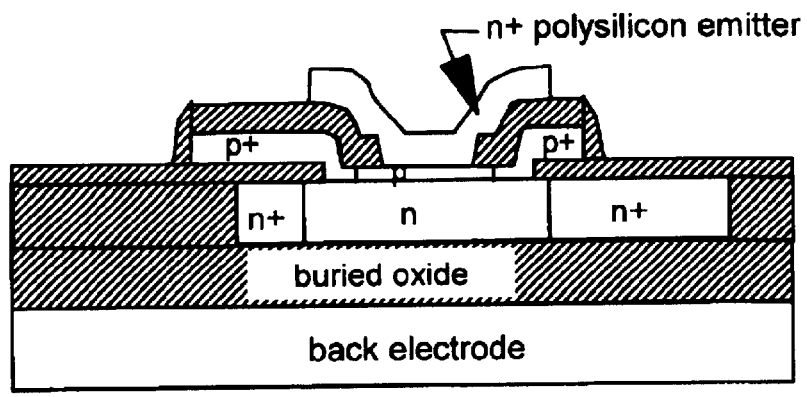
FIG. 17 shows the schematic structure after an n+poly-silicon layer is deposited and patterned.

FIG. 17 shows the structure after an n+poly-silicon layer is deposited and patterned. The poly-silicon layer becomes the emitter of the bipolar transistor.

Figure 18:
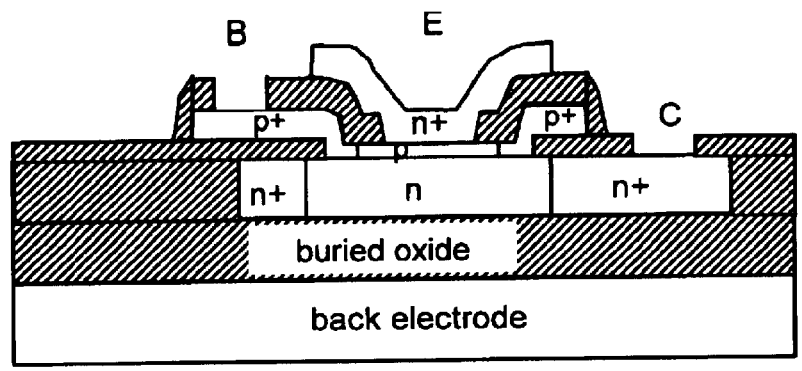
FIG. 18 shows the schematic structure after the opening of contact windows to the base (B) and collector (C).

FIG. 18 shows the opening of contact windows to the base (B) and collector (C).

Figure 19:
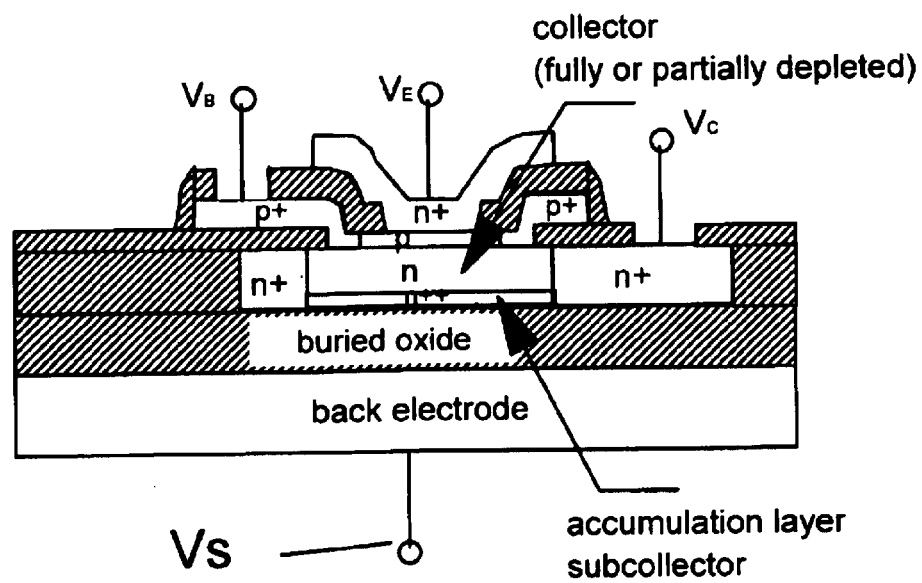
FIG. 19 shows the schematic structure after the application of terminal voltages $V_B$, $V_E$, $V_C$ and $V_s$ to the base, emitter, collector and back electrode, respectively.

FIG. 19 shows the application of terminal voltages $V_B$, $V_E$, $V_C$ and $V_S$ to the base, emitter, collector and back electrode, respectively. The voltage in the back electrode ($V_s$) induces an accumulation layer near the collector/buried oxide interface and forms a low resistance path from the intrinsic collector to the reach-through.

Figure 20:
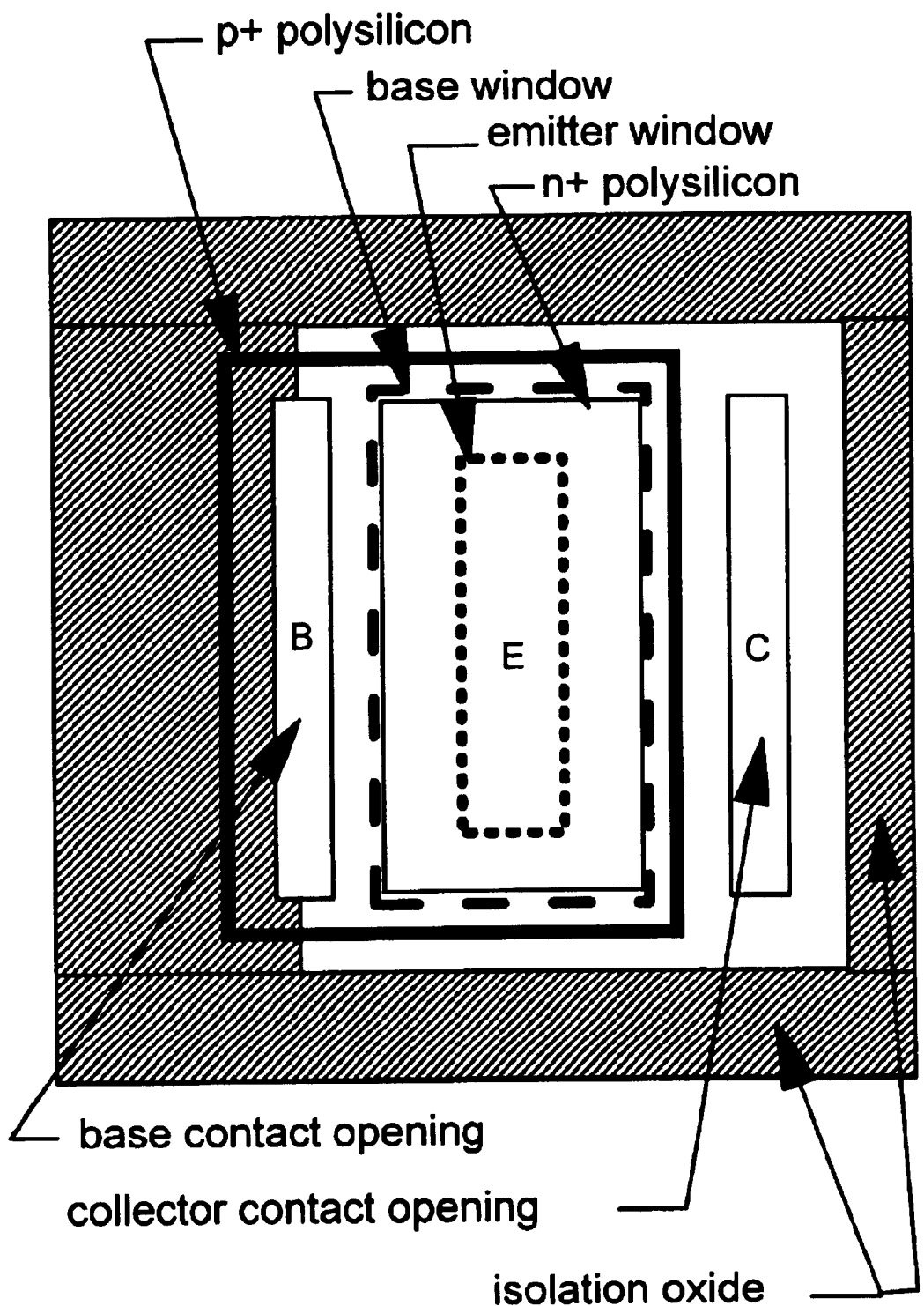
FIG. 20 shows a top view of the device structure.

FIG. 20 gives a top view of the device structure showing the isolation oxide, base window, emitter window, base poly-silicon, emitter poly-silicon and the base and collector contact windows.

Therefore, while there has been described what is presently considered to be the preferred embodiment, it will be understood by those skilled in the art that other modifications can be made within the spirit of the invention.

We claim:

1. A bipolar transistor comprising:
    a conductive region serving as a back electrode for receiving a bias voltage;
    an insulating layer located over the back electrode;
    a first semiconductor layer positioned over the insulating layer and comprising:
        a collector comprising a doped region, of a first conductivity type, positioned over the insulating layer; and
        a reachthrough comprising a heavily doped region of the first conductivity type, bordering with the doped region, the reachthrough being disposed between the insulator layer and a collector contact electrode;
    a base comprising a semiconductor region, of a second conductivity type, located over the doped region of the first layer;
    an emitter comprising a third semiconductor region, of the first conductivity type, located over the base; and
    an accumulation layer, of the first conductivity type, induced by the bias voltage received at the back electrode.

2. The bipolar transistor of claim 1 wherein the base and the doped region of the first semiconductor layer form a diode, the diode having a space-charge region of thickness less than the thickness of the doped region of the first semiconductor layer.

3. The bipolar transistor of claim 1 wherein the base and the doped region of the first semiconductor layer form a diode, the diode having a space-charge region of thickness greater than the thickness of the doped region of the first semiconductor layer.

4. The bipolar transistor of claim 1 wherein the first conductivity type is n-type and the second conductivity type is p-type, and the back electrode receives a voltage of zero or positive value.

5. The bipolar transistor of claim 1 wherein the first conductivity type is a p-type and the second conductivity type is n-type, and the back electrode receives a voltage of zero or negative value.

6. The bipolar transistor of claim 1 wherein the first semiconductor layer comprises a thickness in a range of from 20 to 2000 nanometers.

7. The bipolar transistor of claim 1 wherein the base comprises a silicon-germanium alloy.

8. The bipolar transistor of claim 1 wherein the base comprises a silicon-germanium-carbon alloy.

9. The bipolar transistor of claim 1 wherein the conductive region serving as the back electrode comprises a doped semiconductor region.

10. The bipolar transistor of claim 9 wherein the doped semiconductor region comprises an n-type well in a p-type semiconductor substrate.

11. The bipolar transistor of claim 9 wherein the doped semiconductor region is a p-type well in an n-type semiconductor substrate.

12. The bipolar transistor of claim 1 wherein the reachthrough and the back electrode are electrically connected together, the reachthrough of the collector and the back electrode having substantially the same voltage.

13. An electronic circuit comprising a bipolar transistor of claim 1 and a biasing circuit for providing a bias voltage received at the said back electrode.

14. An integrated circuit comprising a plurality of bipolar transistors, each bipolar transistor comprising:
    a conductive region serving as a back electrode for receiving a bias voltage;
    an insulating layer located over the back electrode;
    a first semiconductor layer positioned over the insulating layer and comprising:
        a collector comprising a doped region, of a first conductivity type, positioned over the insulating layer; and
        a reachthrough comprising a heavily doped region of the first conductivity type, bordering with the doped region, the reachthrough being disposed between the insulator layer and a collector contact electrode;
    a base comprising a semiconductor region, of a second conductivity type, located over the doped region of the first layer;

an emitter comprising a third semiconductor region, of the first conductivity type, located over the base; and an accumulation layer, of the first conductivity type, induced by the bias voltage received at the back electrode.

15. The integrated circuit of claim 14 wherein one common conductive region serves as the back electrode for all bipolar transistors.

16. The integrated circuit of claim 14 wherein each conductive region serving as a back electrode is electrically isolated from other conductive regions serving as a back electrodes by one or more dielectric regions.

17. The integrated circuit of claim 14 wherein each conductive region serving as a back electrode is electrically isolated from other conductive regions serving as a back electrodes by one or more p/n junctions.

18. The bipolar transistor of claim 1 wherein the emitter is a doped poly-silicon layer.

* * * * *